United States Patent [19]

Shepherd et al.

[11] Patent Number: 4,967,042
[45] Date of Patent: Oct. 30, 1990

[54] SYSTEM FOR ENHANCING CURRENT CARRYING CAPACITY OF PRINTED WIRING BOARD

[75] Inventors: Glen C. Shepherd; Dirk Warriner; Charles F. Starks, all of Johnson City, Tenn.

[73] Assignee: Texas Instruments Incorporated, Dallas, Tex.

[21] Appl. No.: 289,332

[22] Filed: Dec. 22, 1988

[51] Int. Cl.$^5$ ............................................. H05K 1/00
[52] U.S. Cl. .................................. 174/250; 361/406; 361/407
[58] Field of Search ..................... 174/68.5, 260, 261, 174/262; 228/180.1; 361/397, 406, 407; 29/831, 846, 850

[56] References Cited

U.S. PATENT DOCUMENTS 3,405,382  10/1968  Wright .............................. 174/68.5
3,560,256   2/1971  Abrams ............................. 174/68.5

OTHER PUBLICATIONS

Harlow, L. A., Re-Usable Interconnection Matrix; IBM Technical Disclosure Bulletin; vol. 13, No. 2, Jul. 1970; p. 433.

*Primary Examiner*—Morris H. Nimmo
*Attorney, Agent, or Firm*—John A. Haug; James P. McAndrews; Melvin Sharp

[57] ABSTRACT

The disclosure relates to a printed wiring board system including a printed wiring board having an electrical conductor on one surface thereof, a pair of apertures extending through the printed wiring board, an electrically conductive jumper extending through the apertures and beyond the surfaces of the printed wiring board surrounding the apertures, the portions of the jumpers extending beyond the electrical conductor carrying surface being positioned along the surface of the board and substantially parallel thereto, solder being disposed over each of the portions of the jumpers extending beyond the conductor carrying surface, the solder extending over the entire region between the portions. The additional solder build up between and around the jumpers substantially increase the current carrying capacity of the jumper and metal trace combination.

12 Claims, 1 Drawing Sheet

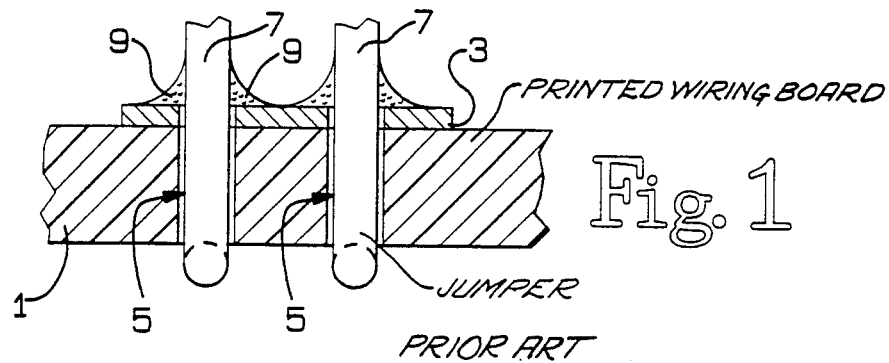
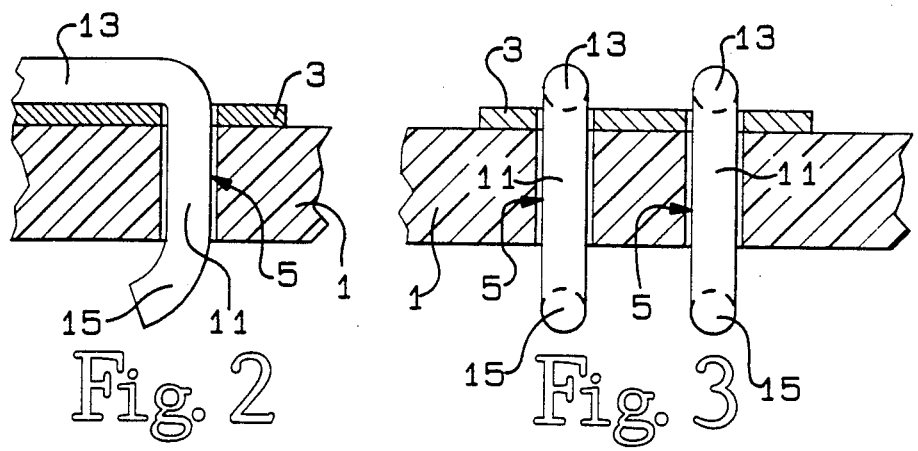
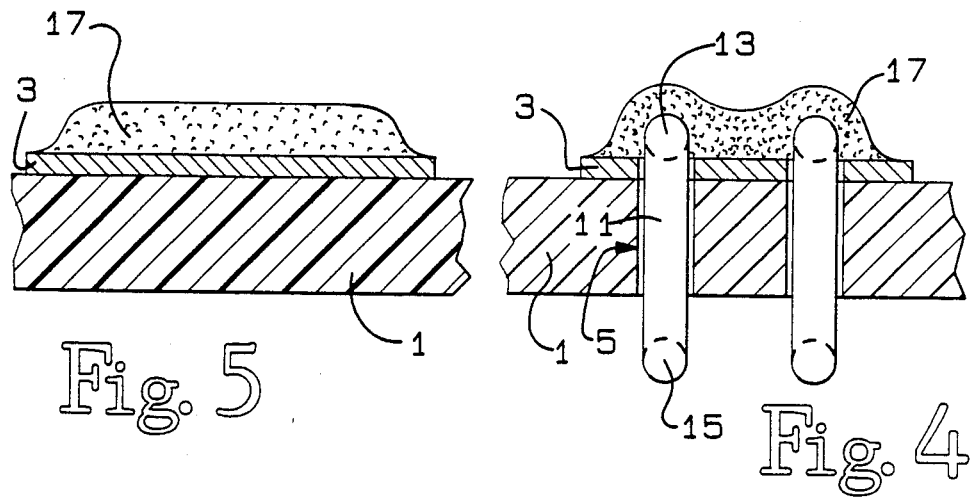

4,967,042

SYSTEM FOR ENHANCING CURRENT CARRYING CAPACITY OF PRINTED WIRING BOARD

BACKGROUND OF THE INVENTION

1. Field of the Invention

This invention relates to printed wiring boards and, more specifically, to a system for enhancing the current carrying capacity of such boards.

2. Brief Description of the Prior Art

There is a present need for high current carrying capacity printed wiring boards in conjunction with electronic applications to automotive drive motors. In such applications, high current relays are soldered to the densely packed mixed technology circuit board and are expected to carry 30 amperes DC current without insulated wiring connecting the relay and the connector. The cost for such circuitry in such applications has been prohibitive in conjunction with known prior art techniques.

On the other hand, presently known Surface Mount Technology (SMT) has caused an increase in the packing density of SMT circuitry boards. This increased density has limited the current carrying capacity of SMT printed wiring boards (PWBs) due to the need for fine line and space circuitry (0.010×0.010 or less). In the prior art, current carrying capacity was increased by using 2 to 4 mil copper foil in PWBs. It is well known in the PMB fabrication art that fine line circuit boards cannot be produced out of heavy copper foil due to excessive undercutting of the traces caused by long copper etching cycles. With these constraints, the current carrying capacity of tightly packed pin-in-hole or surface mount assemblies has suffered. It is therefore apparent that a need has arisen for high current carrying capacity printed wiring boards which can be produced economically.

SUMMARY OF THE INVENTION

In accordance with the present invention, the above noted problem is minimized and there is provided a simple and relatively economical system for fabricating printed wiring boards having relatively high current carrying capacities.

Briefly, there is provided a method for using automatically inserted jumpers not only to increase the current carrying capacity of the printed wiring board conductive paths, but also to use the deposits of tin-lead solder created by the unique position of the jumpers on the printed wiring board to further enhance the current carrying capacity of a fine line circuit assembly.

In accordance with the present invention, a single sided circuit board is provided with metal or copper foil or the like on a surface thereof in standard manner and apertures extending through the board and the copper foil which surrounds the apertures. Jumpers in the form of electrically conductive wires extend through the apertures so that they extend outwardly from the apertures and both surfaces of the board. The jumpers which extend outwardly over the copper foil on the side of the board whereat soldering takes place are bent over the foil and rest along the board and in a plane parallel to the plane of the board. All adjacent jumpers therefore lie in the same plane and, additionally, are positioned to extend parallel to each other. For this reason, when wave soldering takes place, there is a large build-up of solder in the space between adjacent jumpers. The solder adhesion forms a typical solder filet and causes the solder to be trapped between the two parallel jumpers, thereby significantly increasing the cross-sectional area of conductive material on the copper foil trace. On the other hand, with no jumpers installed or with the jumpers on the side opposite wave soldering, in a direction parallel to the apertures and normal to the surface of the board, there is substantially no solder build-up on the solder side conductive paths of the type which had previously significantly increased the current carrying capacity of the circuit. The solder used can be of the eutectic or pure metal type, such solders being well known in the art.

BRIEF DESCRIPTION OF THE DRAWINGS

FIG. 1 is a diagram of a printed wiring board having conventional jumper leads soldered into the apertures thereof in accordance with the prior art;

FIG. 2 is a side view of a printed wiring board having jumper leads prior to soldering in accordance with the present invention;

FIG. 3 is a front view of the printed wiring board and jumper leads of FIG. 2;

FIG. 4 is a cross sectional view of the printed wiring board with jumpers as in FIG. 3 after wave soldering has taken place; and FIG. 5 is a cross sectional view of a printed wiring board without jumpers as in FIG. 2 after wave soldering has taken place.

DESCRIPTION OF THE PREFERRED EMBODIMENT

Referring first to FIG. 1, there is shown a prior art printed wiring board 1 of conventional construction, such as a glass or paper base laminate or other type substrates having a conductor carrying surface with a copper foil conductor 3 thereon and a component receiving surface. A pair of apertures 5 extend through the foil 3 with jumpers 7 passing through the apertures and extending therebeyond in a direction normal to the conductor carrying surface of the board. The portions of the jumpers 7 extending beyond the component receiving surface can be normal or at a slight angle (much less than ninety degrees) thereto. The jumpers 7 are soldered to the copper foil by solder 9 which forms in the usual somewhat triangular solder filet shape in cross section along the jumper, having been drawn along the jumper by capillary and wetting action. As can be seen, the space between the jumpers is relatively devoid of solder and the current carrying capacity of this arrangement is limited due to the shape of the solder filet and the small amount of solder around each lead and interconnecting the jumpers.

Referring now to FIGS. 2 and 3, there is shown a printed wiring board 1 as in FIG. 1 having a copper foil conductor 3 on one surface thereof and a pair of apertures 5 extending therethrough and through the foil. Jumpers 11 pass through the apertures 5 and the portions 13 of the jumpers external to the apertures on the conductor side thereof are generally parallel to each other and are bent at a ninety degree angle upon exiting the aperture on the circuit side and to hold substantially in contact with the foil 3 or very closely adjacent thereto. In addition, the portions 15 of the jumpers 11 exiting the component side of the aperture 5 are normal to the component surface or at a slight angle, holding jumpers 11, 13 in place prior to soldering thereto.

As can be seen from FIGS. 4 and 5, with the application of solder to the portions 13 of the jumpers 11 by standard soldering techniques or the like, the amount of solder 17 between the jumper portions 13 tends to build up both in direction of the jumper along the board 1 as well as in a direction normal to the board. The result is that a great deal more solder is deposited between and over the jumpers 11 when the jumpers are positioned as described with respect to FIGS. 2 and 3 than when positioned as described with respect to FIG. 1. The result is that the current carrying capacity of the embodiment of FIGS. 2 and 3 is about fifty percent greater then the embodiment of FIG. 1 with the jumpers of each having the same cross section and material.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A printed wiring board system comprising:
   (a) a printed wiring board having an electrical conductor on at least one surface thereof:
   (b) at least one pair of adjacent apertures extending through said printed wiring board;
   (c) an electrically conductive jumper extending through each said aperture and beyond the surfaces of said printed wiring board surrounding said apertures;
   (d) the portions of said jumpers extending beyond said one surface being positioned along the surface of said board and substantially parallel to said one surface; and
   (e) solder disposed over essentially the entire portion of each of said jumpers extending beyond said one surface.

2. A printed wiring board system as set forth in claim 1 wherein said electrical conductor is a metal foil.

3. A printed wiring board system as set forth in claim 1 wherein said apertures extend through said electrical conductor.

4. A printed wiring board system as set forth in claim 2 wherein said apertures extend through said metal foil.

5. A printed wiring board system as set forth in claim 1 wherein said portions of said jumpers extending beyond said one surface are disposed parallel to each other.

6. A printed wiring board system as set forth in claim 2 wherein said portions of said jumpers extending beyond said one surface are disposed parallel to each other.

7. A printed wiring board system as set forth in claim 3 wherein said portions of said jumpers extending beyond said one surface are disposed parallel to each other.

8. A printed wiring board system as set forth in claim 4 wherein said portions of said jumpers extending beyond said one surface are disposed parallel to each other.

9. A printed wiring board as set forth in claim 1 wherein said solder is one of a pure metal or a eutectic solder.

10. A printed wiring board as set forth in claim 8 wherein said solder is one of a pure metal or a eutectic solder.

11. A printed wiring board system as set forth in claim 2 in which said foil is copper.

12. A printed wiring board system as set forth in claim 1 including more than one pair of adjacent apertures adjacent to one another, the solder disposed over each of said portions of said jumpers extending beyond said one surface extending over the entire region between said portions.

* * * * *